United States Patent [19]

Teremy

[11] Patent Number: 5,515,392
[45] Date of Patent: May 7, 1996

[54] LASER DIODE CONTROL CIRCUIT WITH POWER SUPPLY COMPENSATION NETWORK

[75] Inventor: Paul Teremy, Rochester, N.Y.

[73] Assignee: Eastman Kodak Company, Rochester, N.Y.

[21] Appl. No.: 369,197

[22] Filed: Jan. 5, 1995

[51] Int. Cl.⁶ ........................................................ H01S 3/00
[52] U.S. Cl. .............................................. 372/38; 372/29
[58] Field of Search ................................. 372/38, 32, 29

[56] References Cited

U.S. PATENT DOCUMENTS

| | | | |
|---|---|---|---|
| H322 | 8/1987 | Simons | 372/29 |
| 4,504,976 | 3/1985 | Beaudet | 455/611 |
| 4,583,128 | 4/1986 | Anderson, Jr. et al. | 358/302 |
| 4,611,352 | 9/1986 | Fujito et al. | 455/609 |
| 4,625,105 | 11/1986 | Hentschel et al. | 250/205 |
| 4,791,632 | 12/1988 | Anderson et al. | 372/31 |
| 4,856,011 | 8/1989 | Shimada et al. | 372/38 |
| 4,868,836 | 9/1989 | Howard | 372/38 |
| 4,945,541 | 7/1990 | Nakayama | 372/31 |
| 4,985,896 | 1/1991 | Kimizuka | 372/38 |
| 5,224,111 | 6/1993 | Stilwell, Jr. et al. | 372/38 |
| 5,224,112 | 6/1993 | Uesaka | 372/38 |
| 5,323,409 | 6/1994 | Laskoskie et al. | 372/38 |

*Primary Examiner*—Leon Scott, Jr.
*Attorney, Agent, or Firm*—Sheridan Ross & McIntosh; David A. Howley

[57] ABSTRACT

The laser diode control circuit includes a laser diode, a photo diode, a transimpedance amplifier network, an inverting amplifier network, a comparison network, a transistor network, and a zener diode. The control circuit is designed for a single power supply. Preferably, the control circuit includes a power supply output compensation network to maintain a constant light output of a laser diode despite variations in voltage level of a voltage source. Preferably, the control circuit includes an input for a digital pulse train to pulse width modulate the light output of a laser diode.

12 Claims, 2 Drawing Sheets

LASER DIODE CONTROL CIRCUIT WITH POWER SUPPLY COMPENSATION NETWORK

FIELD OF THE INVENTION

The invention relates generally to laser diode control circuits, and more specifically to a laser diode control circuit designed for a single power supply and to compensate for variations in the power supply output.

BACKGROUND OF THE INVENTION

Laser diode control circuits usually include a well regulated power supply, a feedback photo diode and other circuit components such as operational amplifiers, resistors, capacitors and diodes. Control circuits are generally designed to regulate the light output of a laser diode. This is usually done by comparing the current output of a feedback photo diode, proportional to the light output of the laser diode, to a reference value and appropriately affecting the light output of the laser diode based on the comparison.

For example, U.S. Pat. No. 4,504,976 by Beaudet, assigned to Societe Anonyme De Telecommunications, Paris, issued Mar. 12, 1985, discloses a device for regulating a laser diode, which includes a photo diode for collecting the light power emitted by the laser diode and means for processing the signal derived by the photo diode to control the power emitted by the laser diode. Additionally, U.S. Statutory Invention Registration No. H322 by Simons, assigned to The United States of America as represented by the Secretary of the Navy, issued Aug. 4, 1987, discloses a controller designed to maintain constant laser output power by sampling the light emitted from the laser diode using a detector, amplifying the output of the detector and comparing the amplified output to a reference voltage using an integrator. The output of the integrator controls a series pass transistor that varies the power to the laser diode to provide a constant laser diode output power.

Additionally, laser diode control circuits have been designed to compensate for variations in the power output of a laser diode. For example, U.S. Pat. No. 4,791,632 by Anderson et al, assigned to Sperry Corporation, issued Dec. 13, 1988, discloses a circuit which compensates for changes to the power output of a laser diode which results from temperature variations and aging.

The control circuits discussed above assume that dual and/or well regulated power supplies are used as the supply voltage(s) and/or to operated the laser diode and the active devices contained in the control circuits. For example, U.S. Statutory Invention Registration No. H322 by Simons, discloses a circuit design requiring a power source having +15 and −15 volt capabilities; and U.S. Pat. No. 4,791,632 by Anderson et al, discloses a design requiring a +V and −V power supply. Additionally, none of these control circuits are designed to compensate for variations in the power supply output. Accordingly, the known control circuits are unsuitable for uses requiring a single power supply and are not designed for power supplies whose power output may decrease with age and use (e.g. a battery).

It would be advantageous to eliminate the need for dual, well regulated power supplies by providing a laser diode control circuit designed for a single power supply. It would be desirable to provide a laser diode control circuit which compensates for variations in power output of a single voltage source. It would be desirable to provide a control circuit which maintains a constant laser diode light output despite variations in the power output of a voltage source. It would be advantageous to provide a laser diode control circuit designed to pulse modulate the light output of a laser diode.

SUMMARY OF THE INVENTION

The laser diode control circuit is designed to control the light output of a laser diode. The circuit eliminates the need for dual, well regulated power supplies by providing a circuit designed for a single power supply. Preferably, the circuit includes a voltage compensating network which maintains a constant light output of the laser diode despite variations in output voltage of the voltage source. For example, the circuit may be used in portable equipment which make use of batteries to supply power. In this example, the circuit compensates for the battery output voltage drop which usually occurs as a result of use and age.

The laser diode control circuit is also designed to receive an input which allows the light output of the laser diode to be pulse width modulated. Preferably, a device which provides a digital pulse train is used to pulse width modulate the light output of the laser diode.

DETAILED DESCRIPTION

Figure 1:
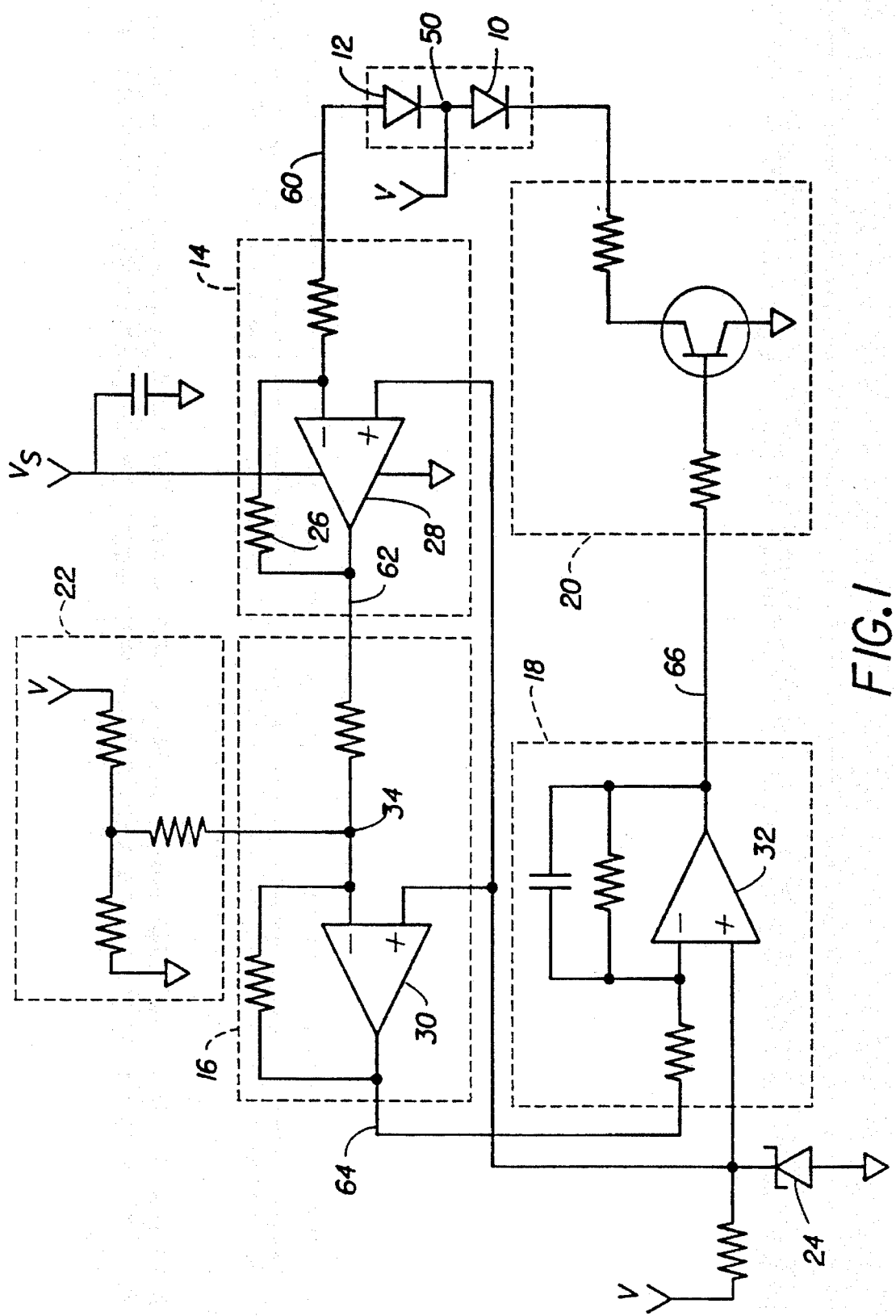
FIG. 1 is a schematic drawing of the laser diode control circuit of the present invention.

Referring to FIG. 1, an embodiment of a laser diode control circuit in accordance with the present invention is shown. The laser diode control circuit includes a voltage source V, a laser diode 10, a photo diode 12, a transimpedance amplifier network 14, an inverting amplifier network 16, a comparison network 18, a voltage compensating network 22, a transistor network 20, and a zener diode 24.

A voltage source V activates a first operational amplifier (i.e. "op amp") 28 in the transimpedance amplifier network 14, a second op amp 30 in the inverting amplifier network 16 and a third op amp 32 in the comparison network 18, as represented generally by the connection of the voltage source V to the first op amp 28. Additionally, a zener diode 24 is connected to the voltage source V to establish a reference voltage which is connected to the positive inputs of the first op amp 28, the second op amp 30 and the third op amp 32.

Generally, the light emitted by a laser diode 10 is dependent on the amount of current flowing through the laser diode 10. With regard to the present invention, the amount of current through the laser diode 10 is controlled by a transistor network 20 which is driven by a comparison network 18. The comparison network 18 accepts as an input on line 64, a signal which is a function of the current delivered on line 60 by the photo diode 12.

As the laser diode 10 starts to emit light in response to a voltage source V applied at point 50, a photo diode 12 located in the axis of emission of light from the laser diode 10 produces a photo current as a function of the light emitted by the laser diode 10. It should be appreciated that solid state laser diodes having a feedback photo diode are available and known to those skilled in the art. Additionally, the application of the voltage source V at point 50 also induces a back bias current in the photo diode 12. As a result, the current delivered on line 60 by the photo diode 12 is the sum of the back bias current and the photo current. The transimpedance amplifier network 14 accepts as an input on line 60, the current delivered by the photo diode 12, and delivers on line 62 an inverted scaled voltage based on the current delivered on line 60 and the loop gain of the first op amp 28. Preferably, the resistor 26 in the feed back of the first op amp 28 is an adjustable resistor, thereby allowing for a variable loop grin, which allows the laser diode output power to be set at the desired level. The inverting amplifier network 16 delivers on line 64 an inverted scaled voltage based on the voltage delivered on line 62 by the transimpedance amplifier network 14 and the loop gain of the second op amp 30.

Upon application of the voltage source V at point 50, the current through the laser diode 10 increases until the voltage delivered on line 64 rises to the reference voltage, which is established by the zener diode 24 connection to the positive input of the third op amp 32. When this occurs, the voltage delivered on line 66 by the comparison network 18 causes the current drawn through the laser diode 10 by the transistor network 20 to be stabilized.

It should be appreciated that in circumstances where a well regulated voltage source V is used, the back bias current delivered on line 64 by the photo diode 12 is constant. Accordingly, any change in the current delivered on line 60 by the photo diode 12 is in response to a change in the light output of the laser diode 10 sensed by the photo diode 12. However, where the voltage output of the voltage source V varies, the back bias current is not constant, but changes according to the variation in the voltage output of the voltage source V. For example, a decrease in the voltage source V causes a corresponding decrease in the current delivered on line 60 by the photo diode 12. Absent a voltage compensating network 22, the change in the current delivered on line 60 is misinterpreted as a change in the light output of the laser diode 10, and the control circuit forces additional current through the laser diode to increase the light output of the laser diode 10.

Preferably, a voltage compensating network 22 is used to make the light output of the laser diode 10 stable as to variations in the voltage source V. More preferably, the voltage compensating network 22 divides the voltage source V and delivers the divided voltage to the negative input of the second op amp 30 to cancel the change in the back bias current introduced by the variation in the voltage supply V. For example, in the circumstance where the control circuit is actively operating to maintain a constant light output of the laser diode 10, a degradation in the voltage output of a battery causes a reduced back bias current to be delivered on line 60 by the photo diode 12. As a consequence, the transimpedance amplifier network 14 delivers on line 62 a correspondingly greater (inverted) voltage. However, the variation in the voltage output of the battery also results in the voltage compensating network 22 delivering a reduced voltage at the negative input of the second op amp 30 which compensates for the greater (inverted) voltage delivered on line 62.

More specifically, the negative input of the second op amp 30 acts as a summing junction 34. Thus, the voltage delivered on line 64 by the inverting amplifier network 16 is the sum of the voltages delivered at the summing junction 34 by the transimpedance amplifier network 14 and the voltage compensating network 22. For example, when a decline in the voltage supply V occurs, the transimpedance amplifier network 14 delivers a voltage on line 62 which is more than the inverted scaled voltage delivered on line 62 prior to the decline in the voltage source V. As a consequence, the reduced voltage delivered by the voltage compensating network 22 cancels the increase in the inverted scaled voltage delivered on line 62. The result is that the voltage delivered on line 64 by the inverting amplifier network 16 is unaffected by the decrease in the back bias current delivered by the photo diode 12 in response to the decline in the voltage source V.

Figure 2:
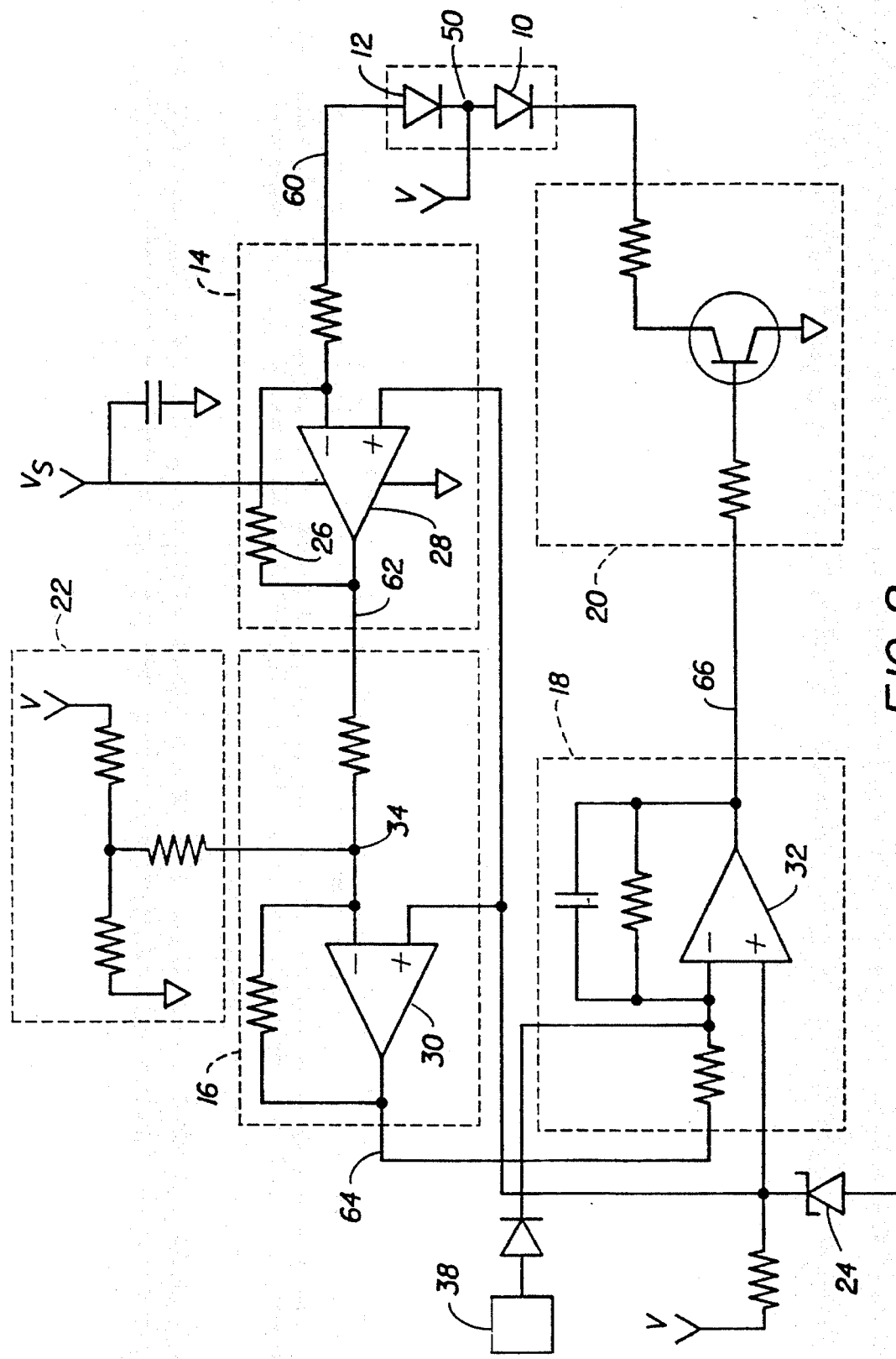
FIG. 2 is a schematic drawing of an alternative embodiment of the laser diode control circuit of the present invention.

Referring now to FIG. 2, an alternative embodiment of the laser diode control circuit of the present invention is shown. In this embodiment, the control circuit of the present invention includes a device 38 for providing a digital pulse train to the negative input of the third op amp 32. As discussed above, the comparison network 18 is designed to drive the transistor network 20 which controls the amount of current through the laser diode 10. Providing a digital pulse train to the negative input of the third op amp 32 causes the transistor 36 in the transistor network to turn-off and -on. As a result, the light output of the laser diode 10 is pulse width modulated based on the frequency of the digital pulse train provided.

The foregoing description of the present invention has been presented for purposes of illustration and description. Furthermore, the description is not intended to limit the invention to the form disclosed herein. Consequently, variations and modifications commensurate with the above teachings, and the skill or knowledge of the relevant art, are within the scope of the present invention. The embodiments described herein are further intended to explain best modes known for practicing the invention and to enable others skilled in the art to utilize the invention in such, or other, embodiments and with various modifications required by the particular applications or uses of the present invention. It is intended that the appended claims be construed to include alternative embodiments to the extent permitted by the prior art.

| ELEMENTS IDENTIFIED BY REFERENCE NUMERAL | |
| --- | --- |
| Reference Numeral | Element |
| 10 | laser diode |
| 12 | photo diode |
| 14 | transimpedance amplifer network |
| 16 | inverting amplifer network |
| 18 | comparison network |
| 20 | transistor network |
| 22 | voltage compensating network |
| 24 | zener diode |
| 26 | feedback resistor |
| 28 | first op amp |
| 30 | second op amp |
| 32 | third op amp |
| 34 | summing junction |
| 36 | transistor |
| 38 | device for digital pulse train |
| 50 | point of connection for voltage source |
| 60 | input line for gain amp network |
| 62 | outbut line for gain amp network |
| 64 | output line for inverting amp network |
| 66 | output line for comparison network |

What is claimed is:

1. An apparatus for regulating light emitted from a laser diode requiring a single positive voltage supply, said apparatus comprising:

(a) a laser diode which emits light when a voltage from the single positive voltage supply is applied to the laser diode;

(b) a photo diode for detecting light emitted from said laser diode and providing a signal as a function of the detected light;

(c) a signal compensating means for providing a signal to compensate for variations in output of the voltage supply; and (d) feedback means, responsive to the signal detected by photo diode and the signal provided by said signal compensating means, for controlling the light emitted by said laser diode.

2. An apparatus as set forth in claim 1, wherein said signal provided by said signal compensation means comprises a divided voltage based on the voltage output of the voltage supply.

3. An apparatus as set forth in claim 1, wherein said feedback means is further responsive to a digital pulse train, for pulse width modulating the light emitted by said laser diode.

4. An apparatus for controlling the optical emission of an optical device, said apparatus requiring a single positive voltage supply, said apparatus comprising:

(a) detection means for detecting an optical signal from an optical emitting device and for providing an electrical signal as a function of the detected optical signal;

(b) compensation means for providing an electrical signal to compensate for a change in the output of the voltage supply; and (c) feed back means responsive to the electrical signal detected by said detection means and responsive to the electrical signal provided by said compensation means, for providing an electrical signal capable of controlling the optical emission of the optical device.

5. An apparatus as set forth in claim 4, wherein said signal provided by said signal compensation means comprises an electrical circuit which provides a divided voltage based on the voltage output of the voltage supply.

6. An apparatus as set forth in claim 4, wherein said feedback means is further responsive to a digital pulse train, for pulse width modulating the optical emission of the optical device.

7. A light emission controller for a laser diode requiring a single positive voltage supply, the laser diode emitting light when a voltage from the single positive voltage supply is applied to the laser diode, said controller comprising:

(a) a photo diode for detecting light emitted from the laser diode and providing a photo current as a function of the detected light and a back bias current as a function of the voltage supply;

(b) a first transimpedance amplifier network responsive to the photo current and the back bias current provided by said photo diode and providing an amplified inverted signal;

(c) signal compensation means for providing an electrical signal to compensate for a change in the back bias current caused by a change in the output of the voltage supply;

(d) a second operational amplifier network, responsive to the signal provided by said first operational amplifier network and the signal provided by said signal compensation means, for providing an amplified inverted comparison signal;

(e) a third operational amplifier network, responsive to the signal provided by said second operational amplifier network, for providing a forward biasing signal; and (f) a transistor network, responsive to the signal provided by said third operational amplifier network, for controlling the amount of light emitted by the laser diode.

8. A light emission controller for a laser diode as set forth in claim 7, wherein said signal compensation means comprises an electrical circuit which provides a summing voltage as a function of the voltage output of the voltage supply.

9. A light emission controller for a laser diode as set forth in claim 7, wherein said third operational amplifier network is further responsive to a digital pulse train, for providing a forward biasing signal which allows said transistor network to pulse width modulate the light emitted by the laser diode.

10. A method for compensating for a change in the voltage output of a single voltage source used to activate a laser diode control circuit, said method comprising the steps of:

(a) applying a voltage to a feedback photo diode;

(b) generating a reverse bias current in the photo diode;

(c) compensating for a change in the reverse bias current resulting from a change in the voltage source;

(d) controlling the light output of the laser diode such that the light output of the laser diode is unaffected by the change in the reverse bias current, due to a change in the voltage source.

11. A method as set forth in claim 10, wherein said step of compensating comprises providing a divided voltage based on the voltage output of the voltage supply.

12. A method as set forth in claim 10, further comprising the step of accepting a digital pulse train, wherein the step of controlling further comprises controlling the light output of the laser diode in response to said digital pulse train.

* * * * *